United States Patent
Jeter et al.

(10) Patent No.: US 10,734,983 B1
(45) Date of Patent: Aug. 4, 2020

(54) DUTY CYCLE CORRECTION WITH READ AND WRITE CALIBRATION

(71) Applicant: Apple Inc., Cupertino, CA (US)

(72) Inventors: Robert E. Jeter, Santa Clara, CA (US); Rakesh L. Notani, Santa Clara, CA (US); Kai Lun Hsiung, Fremont, CA (US); Yanzhe Liu, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/277,263

(22) Filed: Feb. 15, 2019

(51) Int. Cl.
*G11C 11/409* (2006.01)
*H03K 3/017* (2006.01)
*H03K 5/156* (2006.01)

(52) U.S. Cl.
CPC .......... *H03K 5/1565* (2013.01); *G11C 11/409* (2013.01); *H03K 3/017* (2013.01)

(58) Field of Classification Search
CPC ..... G11C 11/409; H03K 3/017; H03K 5/1565
USPC .......................................................... 327/175
See application file for complete search history.

(56) References Cited

U.S. PATENT DOCUMENTS

| | | | |
|---|---|---|---|
| 7,417,902 B2 * | 8/2008 | Park | G11C 7/1078 365/189.07 |
| 8,644,085 B2 | 2/2014 | Kim et al. | |
| 8,665,665 B2 | 3/2014 | Huang | |
| 9,049,057 B2 * | 6/2015 | Krishnamoorthy | H04L 27/00 |
| 9,164,933 B2 | 10/2015 | Zerbe et al. | |
| 9,412,428 B2 * | 8/2016 | Giovannini | G11C 7/222 |
| 9,558,849 B1 | 1/2017 | Fung et al. | |
| 9,627,029 B2 * | 4/2017 | Morris | G11C 7/22 |
| 10,191,797 B2 * | 1/2019 | Lee | G06F 11/079 |
| 10,482,935 B2 * | 11/2019 | Park | G11C 16/32 |
| 2004/0213067 A1 * | 10/2004 | Best | G06F 1/10 365/222 |
| 2007/0008791 A1 * | 1/2007 | Butt | G11C 7/1006 365/193 |
| 2009/0146715 A1 * | 6/2009 | Jiang | H03K 5/135 327/175 |
| 2010/0315119 A1 * | 12/2010 | Welker | H03K 5/1565 326/30 |
| 2011/0239063 A1 * | 9/2011 | Zerbe | G06F 13/1689 714/719 |
| 2012/0250426 A1 * | 10/2012 | Huang | G11C 7/1066 365/189.07 |
| 2012/0257466 A1 * | 10/2012 | Kim | H03K 5/1565 365/193 |
| 2019/0109585 A1 * | 4/2019 | Tang | H03K 3/017 |
| 2019/0237127 A1 * | 8/2019 | Moon | G06F 3/0604 |

* cited by examiner

*Primary Examiner* — William Hernandez
(74) *Attorney, Agent, or Firm* — Kowert, Hood, Munyon, Rankin & Goetzel, P.C.; Erik A. Heter

(57) ABSTRACT

A method and apparatus for performing duty cycle correction with read/write calibrations is disclosed. A first calibration is performed in a memory subsystem having a memory and a memory controller. The first calibration includes conveying a first clock signal from the memory controller to the memory, and determining the duty cycle of the first clock signal. If the duty cycle is not within a specified range, the duty cycle is adjusted and the process repeated. After the duty cycle of the first clock signal is within the specified range, a second calibration is performed, the second calibration including conveying a second clock signal from the memory to the memory controller. The duty cycle of the first clock signal may be further adjusted based on the second calibration.

20 Claims, 5 Drawing Sheets

DUTY CYCLE CORRECTION WITH READ AND WRITE CALIBRATION

BACKGROUND

Technical Field

This disclosure is directed to memory subsystems, and more particularly, calibration of signals conveyed in memory subsystems.

Description of the Related Art

Eye patterns, or eye diagrams, are graphic illustrations that illustrate times and amplitudes at which a digital signal can be sampled at its correct value. In various types of systems that include data transmissions, sampling of signals (based on a clock signal) near a center of an eye, in terms of time, may be desirable. This may provide a signal with a sufficient amount of both setup and hold time, while also rendering it less susceptible to noise. In sampling a signal, a threshold voltage is used to determine whether the signal is interpreted as a logic 0 or a logic 1.

In memory systems, calibrations may be performed to determine the points at which signals are sampled within the eye pattern. Calibrations may be performed to determine both the point in time at which signals are sampled, as well as to determine the threshold voltage for distinguishing between logic 0's and logic 1's. Performing these calibrations typically includes adjusting a number of different parameters that govern transmission of data between a memory controller and a memory. Such calibrations may be performed on a periodic basis.

SUMMARY

A method and apparatus for performing duty cycle correction with read/write calibrations is disclosed. In one embodiment, a first calibration is performed in a memory subsystem having a memory and a memory controller. The first calibration includes conveying a first clock signal from the memory controller to the memory, and determining the duty cycle of the first clock signal. If the duty cycle is not within a specified range, the duty cycle is adjusted and the process repeated. After the duty cycle of the first clock signal is within the specified range, a second calibration is performed, the second calibration including conveying a second clock signal from the memory to the memory controller. The duty cycle of the first clock signal may be further adjusted based on the second calibration.

In one embodiment, the second calibration includes performing reads of data from the memory, wherein the reads are synchronized by the second clock signal. Additional adjustment of the duty cycle, relative to those made during the first calibration, may be performed. The second calibration may include determining the range of delay values of the second clock signal at which data may be correctly read from the memory. Accordingly, adjustments to the duty cycle of the first clock signal (upon which the second clock signal is generated) may be made to ensure the widest possible range of delay values at which data can be correctly read from memory.

BRIEF DESCRIPTION OF THE DRAWINGS

The following detailed description makes reference to the accompanying drawings, which are now briefly described.

Figure 1:
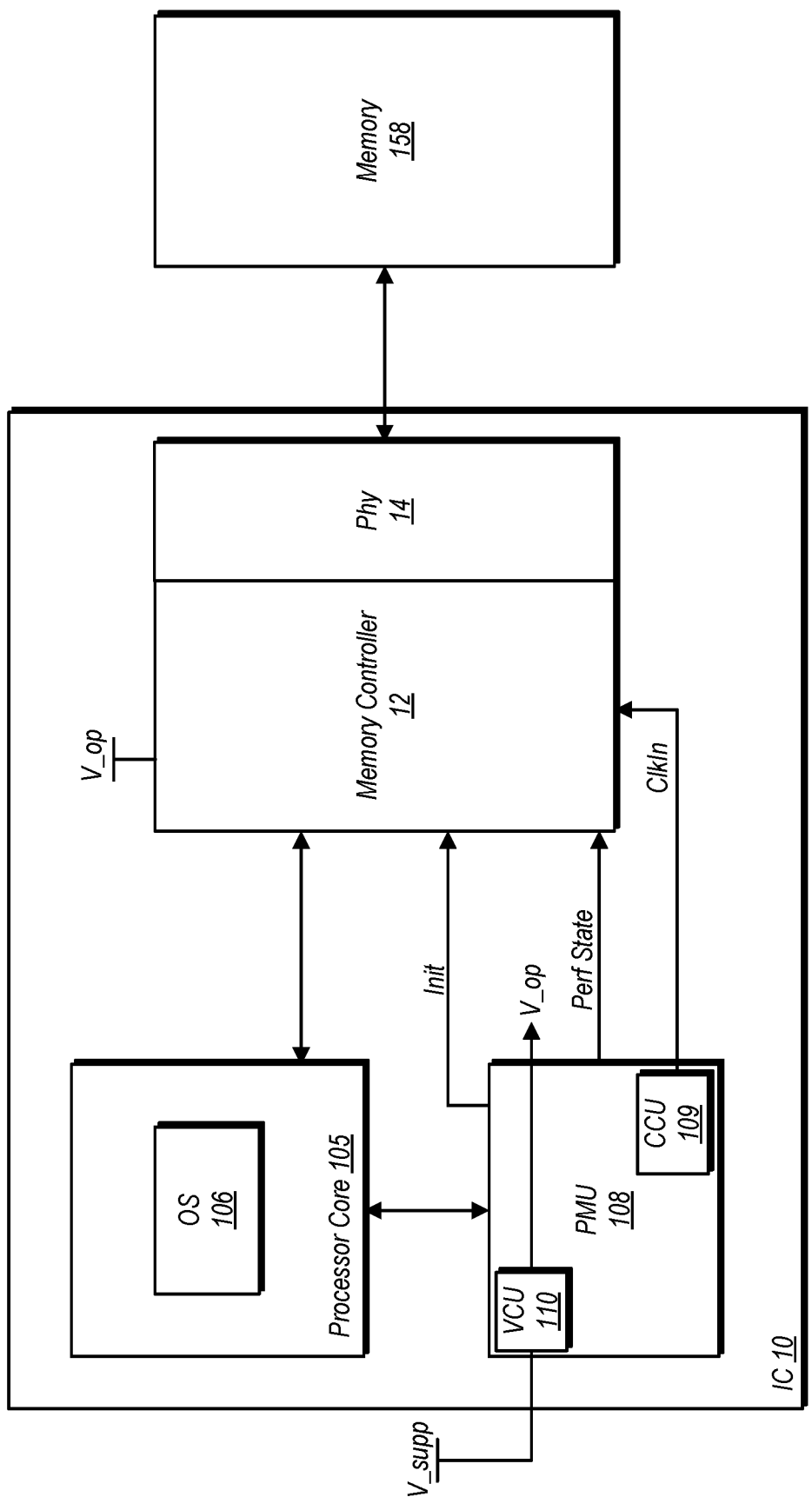
FIG. 1 is a block diagram of one embodiment of an integrated circuit and a memory coupled thereto.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to various method and apparatus embodiments in which duty cycle correction (of data strobe signals) is performed in conjunction with read/write calibrations. In one embodiment, a memory subsystem includes a memory controller and a memory coupled thereto. In addition to including storage locations, the memory also includes a duty cycle monitor circuit coupled to receive a first clock signal (e.g., a write data strobe) from the memory controller. The duty cycle monitor circuit may make a determination as to whether a duty cycle of the received first clock signal is within a specified range, and provide a corresponding indication to the memory controller. The memory further includes an adjustment circuit arranged to adjust the duty cycle of the first clock signal, responsive to a command received from the memory controller.

During a first calibration, the first clock signal is conveyed for a limited time to the memory, with the duty cycle monitor determining the duty cycle thereof. If the duty cycle is not within a specified range, the adjuster may be incremented and the first clock signal is again conveyed to the memory, including the duty cycle monitor. This may be repeated until the duty cycle monitor provides an indication that the duty cycle is within its specified range (e.g., >=50%). Thereafter, a second calibration is conducted with respect to a second clock signal (e.g., a read data strobe). The second clock signal is generated by a clock generation circuit within the memory, and is based on the first clock signal. The second calibration includes performing reads of data from the memory at various values of delay as applied to the second clock signal as received by the memory controller. Based on the second calibration, a width of an eye pattern may be determined for at least those reads that are synchronized in accordance with the second clock signal. Furthermore, additional adjustments may be made to the duty cycle of the first clock signal. This may ensure that the duty cycle of the first clock signal (and thus, the second clock signal generated based thereon) is within its specified range, and may also ensure the widest possible eye pattern.

Turning now to FIG. 1, a block diagram of one embodiment of an integrated circuit (IC) coupled to a memory is shown. IC 10 is shown here as a simplified block diagram including various units/circuits implemented thereon. However, other embodiments are possible and contemplated, and may include additional circuits/units not shown here or explicitly discussed herein.

In the embodiment shown, IC 10 is coupled to a memory 158. In one embodiment, memory 158 is a dynamic random access memory (DRAM), although the scope of this disclosure is not limited to DRAM.

IC 10 in the embodiment shown includes at least one processor core 105, although multiple instances of the same may be present. Processor core 105 is configured to execute software instructions, including those of operating system (OS) 105. The instructions of OS 106 may, when executed, cause various system management functions to be performed, such as memory allocation, performance state changes, and so forth.

IC 10 also includes a power management unit (PMU) 108 in the illustrated embodiment. PMU 108 may implement circuitry that performs various power control functions, such as operating voltage changes, power gating, clock frequency changes, and clock gating. These power control functions may be performed in conjunction with performance state changes. Such performance state changes may be put into effect via execution of instructions of OS 106 or through other mechanisms within PMU 108 itself. A performance state (which may also be referred to herein as an operating point) may be defined as combination of an operating voltage and clock frequency. These parameters may be adjusted for desired performance and power savings. For example, if high performance is desired at a given time during operation, the clock frequency and/or the operating voltage may be increased. If reducing power consumption is prioritized at a given time during operation, the clock frequency and/or supply voltage may be reduced. In general, PMU 108 may adjust the clock frequency and operating voltage during operation in an attempt to optimize the amount of performance achieved per watt of power consumed.

PMU 108 in the illustrated embodiment includes a clock control unit (CCU) 109. A clock signal, ClkIn, may be provide from CCU 109 to a memory controller 12 of IC 10. This clock signal may be generated internal to CCU 109, or by other clock generation circuitry external thereto.

PMU 108 in the embodiment shown also includes a voltage control unit (VCU) 110. An external supply voltage, V_supp, is provided to VCU 110. Circuitry within VCU 110 may adjust the voltage output therefrom, V_op, which is the operating voltage supplied to memory controller 12, among other places. PMU 108 may accomplish performance state changes by adjusting the frequency of the clock output from CCU 109, changing the operating voltage, or both.

Memory controller 12, which includes physical interface (PHY) 14, provides an interface between processor core 105 and memory 158. Although not explicitly shown, IC 10 may also include one or more units of interface circuitry that are also coupled to memory controller 12. Accordingly, memory controller 12 may provide an interface for one or more circuits external to IC 10 and memory 158.

During operation, memory controller 12 may operate in a number of different performance states. The different performance states may in turn utilize different frequencies for ClkIn with respect to one another, and different operating voltages as well. In some embodiments, the decision to change the performance state may be made by OS 106. In other embodiments, the decision may be made by PMU 108. In either case, PMU 108 may provide an indication ('Perf State') that a performance state change is pending. Memory controller 12 may use the information of the pending clock frequency change to perform certain actions.

Figure 2:
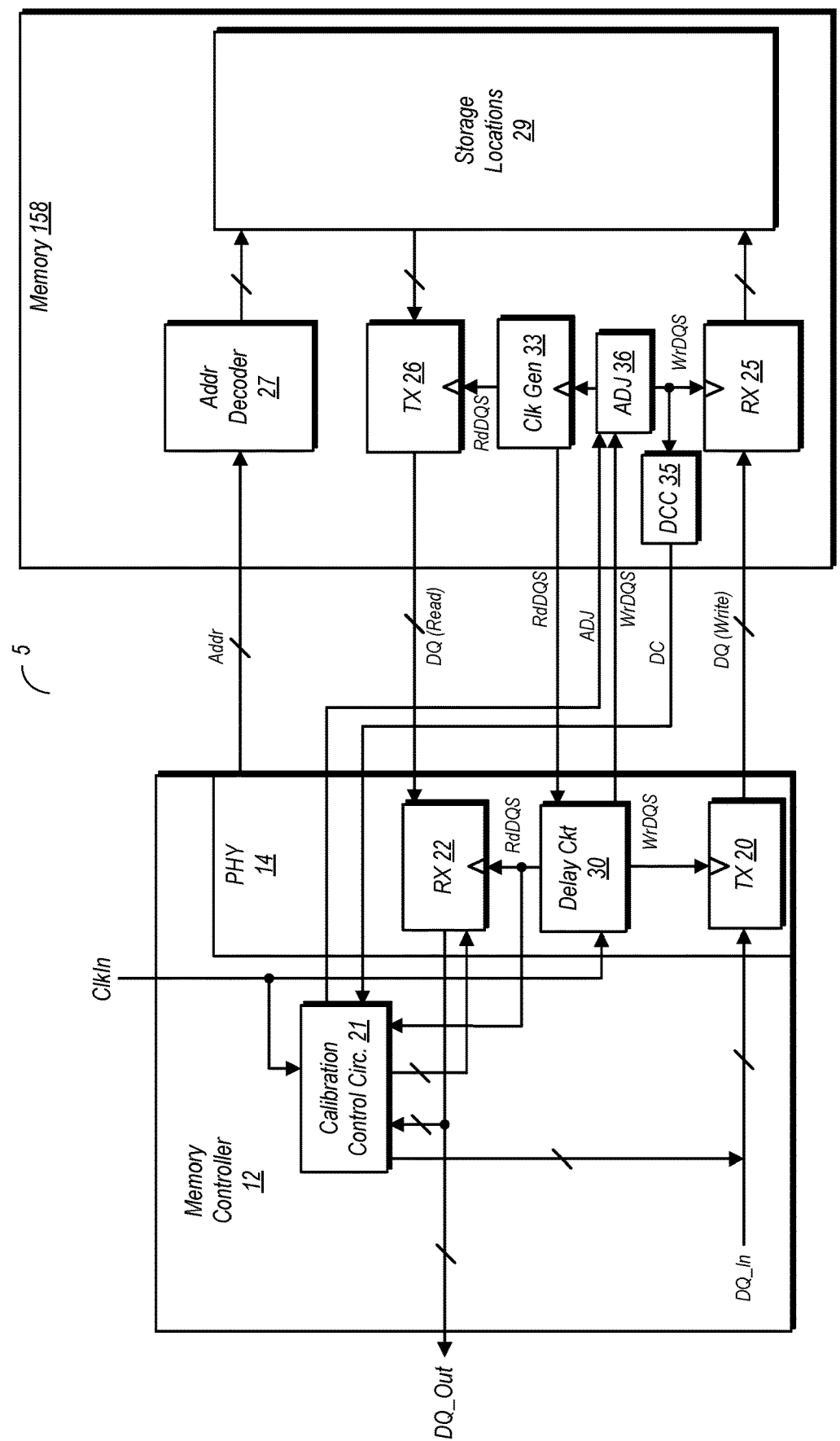
FIG. 2 is a block diagram of one embodiment of a memory subsystem.

Turning now to FIG. 2, a block diagram of a system having a memory controller and a memory is shown. In the embodiment shown, system 5 includes a memory controller 12 and a memory 158. The memory controller 12 includes a physical layer 14 which is used for interfacing with memory 158. The physical layer 14 includes a receiver 22 configured to receive data read from memory 158 ('DQ (Read)'), and a transmitter 20 configured to transmit data to memory 158 ('DQ (Write)'). Memory 158 includes an address decoder 27, a number of storage locations 29, a receiver 25 configured to receive data to be written and a transmitter 26 configured to transmit data that has been read. Although not explicitly shown, memory 158 may include additional logic for receiving read and write enable signals, with such logic being configured to enable selected storage locations for read and write operations, respectively. Additionally, memory controller 12 in the embodiment shown includes calibration control circuit 21, which includes circuitry that perform various embodiments of a calibration method discussed below.

Physical layer 14 includes a delay circuit 30 that is coupled to receive an input clock signal ('Clk'). In the embodiment shown, delay circuit 30 may include two separate paths to apply delays to the input clock signal to generate a write data strobe ('WrDQS') and to apply delay to a read data strobe ('RdDQS') received from memory 158. For example, one embodiment of delay circuit 30 may include a pair of delay locked loops (DLLs), one configured to output the write data strobe to memory, and one configured to apply delay to the read data strobe received from memory. The delays of the respective DLL's may be set according to control signals generated elsewhere in memory controller 12, e.g., in calibration control circuit 21. Types of delay circuits other than DLL's are also possible and contemplated for various other embodiments. Delay circuit 30 in the embodiment shown receives the read data strobe from clock generation circuit 33 in memory 158 and provides a corresponding version of the read data strobe to receiver 22 in physical layer 14. The read data strobe signal may be used in synchronizing reads of data from memory 158. The write data strobe in the embodiment shown is provided from delay circuit 30 to transmitter 20 of physical layer 14, and also provided to receiver 25 in memory 158. Accordingly, the write data strobe may be used in synchronizing writes to memory 158.

Delay circuit 30 may provide the read data strobe to receiver 22 in physical layer 14 based on receiving the corresponding read data strobe signal from memory 158. The read data strobe signal may be used in synchronizing reads of memory 158. The write data strobe may be provided to transmitter 20 of physical layer 14, along with receiver 25 of memory 158. Accordingly, the write data strobe may be used in synchronizing writes to memory 158.

Memory 158 in the embodiment shown includes an address decoder 27 coupled to receive an address ('Addr') from physical layer 14 of memory controller 12. Address decoder 27 may decode the received address to enable particular ones of the storage locations 29 that are to be enabled for a current memory operation. Addresses may be provided from physical layer 14 of memory controller 12 for both read operation and write operations. Memory 158 also includes a receiver 25 coupled to receive data to be written ('DQ(Write)') to those storage locations 29 selected by address decoder 27. Receiver 25 is also coupled to receive the write data strobe, WrDQS. The write data strobe signal is also provided to a clock generation circuit 33, which is configured to generate the read data strobe, RdDQS, based on the write data strobe. Clock generation circuit 33 may be implemented using various types of circuitry, such as a delay locked loop (DLL) or other circuit that can output a periodic signal based on an input periodic signal. The read data strobe is provided both to transmitter 26 in memory 158 (from which read data, 'DQ(Read)', is conveyed to memory controller 12), as well as directly to delay circuit 30 in memory controller 12.

Memory 158 in the embodiment shown also includes a duty cycle circuit (DCC) 35 that monitors the duty cycle of the incoming write data strobe. An indication of the duty cycle, 'DC', may be provided from DCC 35 to calibration control circuit 21. In one embodiment, the indication provides information as to whether or not the duty cycle of the incoming write data strobe is within a specified range (e.g., >=50%). However, other embodiments are possible and contemplated that may provide more detailed information as to the actual value of the duty cycle. Memory 158 also includes an adjuster circuit 36, which is coupled to receive the write data strobe from memory controller 12 and provide a copy of the same to DCC 35. Adjuster circuit 35 may adjust the duty cycle based on an adjustment command or code, 'ADJ', provided in this embodiment by calibration control circuit 21. Adjuster circuit 35 may include any type of signal shaping/phase adjustment circuitry that can alter the duty cycle of a received periodic signal, and may include one or more DLLs, flip-flops, and other types of circuits.

Calibrations of the data strobe signals may be performed under the direction of calibration control circuit 21 in the embodiment shown. The data strobe signals provided/received by delay circuit 30 may be subject to inherent delays, particularly on the side of memory 158. Since the clock edges of the data strobe signals are used to validate data received from memory controller 12 when received by receiver 25 at memory 158, as well as to validate data transmitted from transmitter 26 of memory 158, it is important that setup and hold time requirements for both are observed. Moreover, the data strobe signals used herein are used to synchronize the sampling of multiple bits. Furthermore, the signal paths for conveying bits between memory controller 12 and memory 158 may each be subject to their own unique delays, and thus some inter-lane skew may be present among the data bits. It is desirable that each data signal be sampled at or near the center of a window that may be depicted by an eye diagram (or eye pattern). Accordingly, procedures to calibrate the data strobe signals to compensate for inherent delays may be performed at certain times during operation of memory controller 12 in order to optimize the point in time at which the data strobe signals sample data. The calibration procedures conducted under the control of calibration control circuit 21 involve performing a number of reads of from memory along with adjustments of an amount of delay applied to the data strobe signal being calibrated. The delays may be adjusted in accordance with a delay code that is provided from calibration control circuit 21 to delay circuit 30.

The calibration of the data strobe delay may be performed periodically, and may sometimes be referred to as a horizontal calibration. These calibrations may be conducted for both the read data strobe and the write data strobe.

In addition to calibrating the data strobe signals for delays, a calibration may be performed with respect to the duty cycle of the signals. In one embodiment, a calibration may include calibrating the duty cycle of the write data strobe to within a specified range and then performing a subsequent calibration that includes determining a width of an eye pattern for the read data strobe and may further include doing the same for the write data strobe. The calibration of the duty cycle may include providing the write data strobe to memory 158 for a limited duration, and thereafter, receiving an indication from DCC 35 regarding the duty cycle. If the duty cycle of the write data strobe signal is not within the specified range, calibration control circuit may send an adjustment code to the adjuster circuit 36 to change the duty cycle. The sending of the write data strobe may then be repeated, and another indication send from DCC 35 to calibration control circuit 21. This may continue until DCC 35 indicates that the duty cycle is within the specified range.

Upon completing the calibration of the duty cycle of the write data strobe, a subsequent calibration may be performed with respect to the read data strobe, recognizing that since the latter is generated based on the former, changes to the duty cycle can affect both of these signals. The calibration of the read data strobe includes performing writes of data to memory and reads of data back to memory controller using various values of delay applied to the read data strobe. The data read from memory is compared to expected data, and if all bits match, the data is considered to provide a passing result. The width of an eye diagram for reading data may be defined by the maximum and minimum values of delay, as applied to the read data strobe, at which passing results can be obtained. A similar calibration can be performed with respect to the write data strobe signal, writing and reading data with various values of delay applied thereto. Based on the subsequent calibration(s) with respect to delay of a data strobe signal, the duty cycle of the write data strobe signal may be further adjusted. Thus, the combination of the duty cycle and delay calibrations may ensure the widest possible eye for performing reads and writes while also ensuring that the duty cycle of these signals are within a specified range.

It is noted that the calibrations performed with respect to applied delays may be dependent on a reference voltage used to determine whether a received bit is a logic 0 or a logic 1. As an eye pattern includes both a vertical axis, based on variations of the reference voltage, as well as a horizontal axis, based on variations of delay as applied to a corresponding data strobe signal, the horizontal width of the eye pattern may vary with the reference voltage. Accordingly, the calibrations discussed above may be repeated for different values of a reference voltage.

Figure 3:
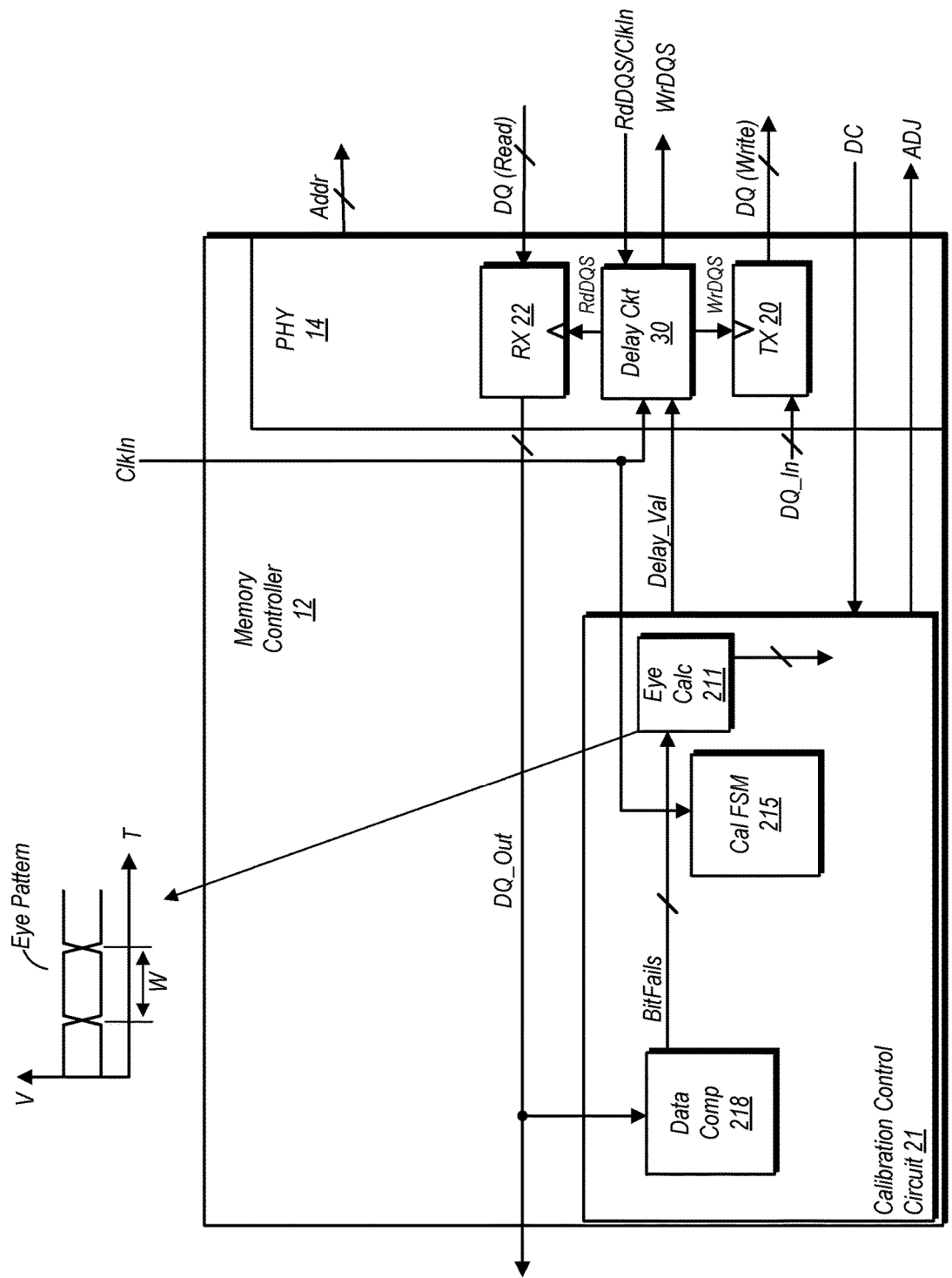
FIG. 3 is a block diagram illustrating one embodiment of a memory controller having a calibration control circuit.

Turning to FIG. 3, is a block diagram of one embodiment of a memory controller is shown. In particular, FIG. 3 illustrates further details of one embodiment of a memory controller 12 that may be used in the memory subsystem discussed with reference to FIG. 2.

In the embodiment shown, calibration control circuit 21 includes calibration finite state machine (FSM) 215, data comparator 218, and an eye calculator 211. Calibration FSM 215 in the embodiment shown implements circuitry that includes a state machine that carries out various calibration functions. Among these functions performed by calibration FSM 215 is causing the incrementing of delay values in delay circuit between the data transmissions of the particular calibration being performed. In some embodiments, calibration FSM 215 may also generate data to be transmitted during the performance of a calibration (or iteration thereof), although embodiments where such calibration data is generated elsewhere are also possible and contemplated.

Calibration control circuit 21 may provide a delay code ('Delay_Val' in this figure) to delay circuit 30 in order to set and vary the delay applied to the data strobe signals. The delay code may be generated by, e.g. calibration FSM 215, or other circuitry within calibration control circuit 21.

Data comparator 218 in the embodiment shown compares data received from the memory, during calibrations, to expected data. A passing result occurs when all bits of the received data match the expected data. A failing result occurs when one or more bits of received data do not match the expected data. Information regarding bit failures are forwarded from data comparator to eye calculator 211. Based on the pass fail information received, eye calculator 211 may determine a range of delay values, as applied to the data strobe signal under calibration, for which passing results are obtained. Additionally, eye calculator 211 may also include registers or some other suitable storage mechanism for storing the various values corresponding to the eye pattern. An example eye pattern is shown in the upper portion of FIG. 2, with the value W along the horizontal axis ('T') indicative of the width thereof.

Calibration control circuit 21 in the embodiment shown is further coupled to receive a duty cycle indication, 'DC', from memory 158, and may also provide an adjustment code, ADJ, thereto. The duty cycle indication may indicate, in one embodiment, whether or not the duty cycle is within a specified range, although other embodiments may indicate an actual value of the duty cycle. The adjustment code may be varied to change the duty cycle at the adjustment circuit 36 in memory 158.

As discussed above, calibration control circuit 21 may also perform reference voltage calibrations (which may be referred to as vertical calibrations, along the 'V' axis as shown in the example eye diagram, where 'V' is representative of various values of a reference voltage). The reference voltage is a voltage that is used to distinguish between a logic 0 and a logic 1 as received. Thus, the eye pattern determined by eye calculator is based both on various ranges of delay values (horizontal) and ranges of reference voltages (vertical). It is therefore noted that the calibrations that include end point replay as discussed herein may be performed for different values of the reference voltage, and further noted that both the initial and final end points may vary along with the reference voltage. Generally speaking the eye pattern may become narrower (from the horizontal perspective) for the highest and lowest values of the reference voltage, and wider for reference voltage values between these extremes.

The calibrations discussed herein may be performed periodically, or may be performed responsive to certain events (e.g., performance state changes). Generally speaking, these calibrations may be performed on any suitable schedule.

Figure 4:
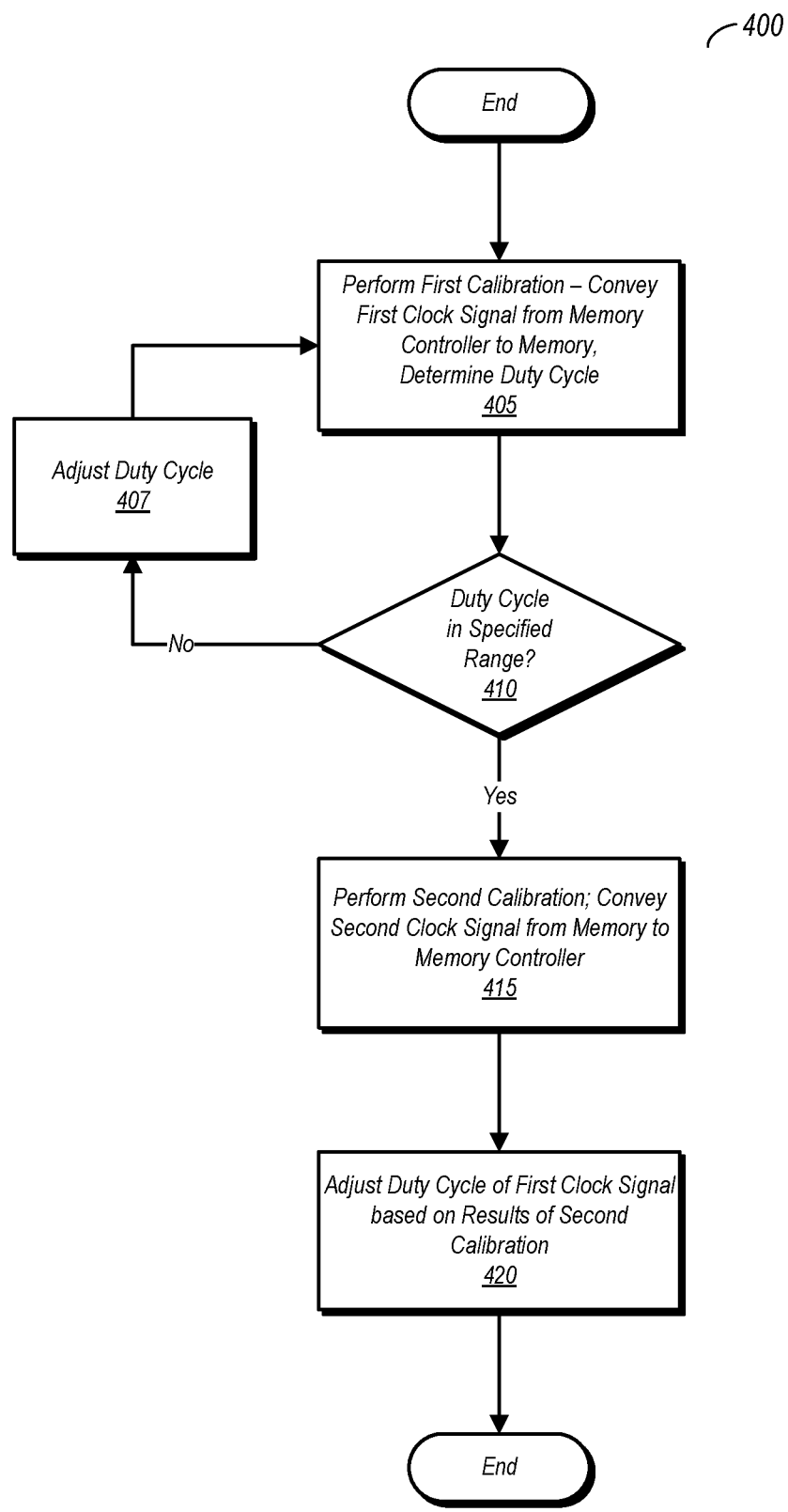
FIG. 4 is a flow diagram illustrating one embodiment of a method for performing a calibration of data strobe signals that includes duty cycle adjustment.

FIG. 4 is a flow diagram illustrating one embodiment of a method for performing a calibration of data strobe signals that includes duty cycle adjustment. Method 400 as discussed herein may be performed with any apparatus embodiment as discussed above. Additionally, apparatus embodiments not explicitly discussed herein but otherwise capable of carrying out method 400 may nevertheless fall within the scope of this disclosure.

Method 400 includes performing a first calibration in which a first clock signal (e.g., a write data strobe) is conveyed from a memory controller to a memory, wherein the duty cycle of the first clock signal is determined (block 405). The first clock signal may be conveyed for a limited duration, e.g., a few microseconds, before the determination is made. If the duty cycle is not within a specified range (block 410, no), the duty cycle is adjusted (block 407) and block 405 repeats. If the duty cycle is within the specified range (block 410, yes), a second calibration is then performed, the second calibration including conveying a second clock signal (e.g., a read data strobe) from the memory to the memory controller (block 415). The second calibration may include performing writes and reads of data and comparisons to expected values with different values of delay applied to the second clock signal. Based on the results of the second calibration, additional adjustments may made to the duty cycle of the first clock signal (block 420). This may ensure that both the duty cycle is within the specified range, while also determining the width of an eye pattern indicative of a range of delay values that can be applied to the calibrated clock signals that allow data to be correctly written to and read from memory.

Determination of the duty cycle of the first clock signal may be performed by a duty cycle monitoring circuit. Adjustments to the duty cycle may be performed by an adjustment circuit in accordance with, e.g., a code received thereby. The second clock signal, conveyed from the memory to the memory controller, may be generated based on the first clock signal received by the former from the latter, using suitable circuitry for generating an output clock signal based on a received input clock signal.

Figure 5:
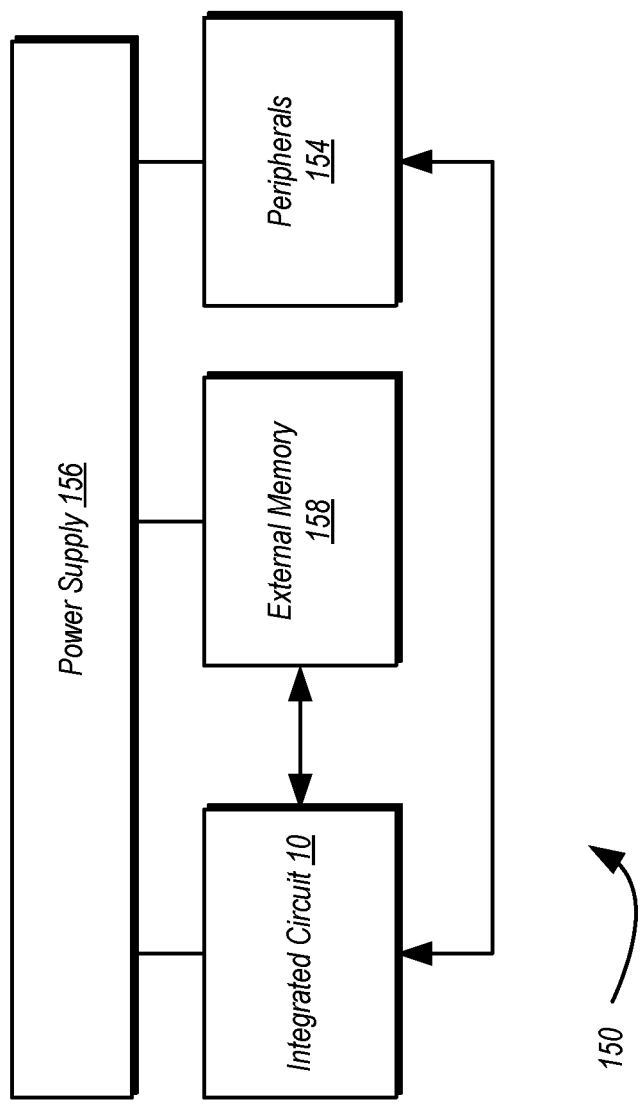
FIG. 5 is a block diagram illustrating one embodiment of a system.

Turning next to FIG. 5, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

IC 10 in the embodiment shown here may include a memory controller as discussed above in, e.g., FIGS. 2 and 3, while memory 158 may include various circuits as also discussed above. The various circuitry may be arranged to perform the various calibrations discussed in this disclosure.

Numerous variations and modifications will become apparent to those skilled in the art once the above disclosure is fully appreciated. It is intended that the following claims be interpreted to embrace all such variations and modifications.

What is claimed is:

1. A method comprising:
performing a first calibration in a memory subsystem having a memory controller and a memory, wherein performing the first calibration comprises a calibration control circuit of the memory controller performing the following:
conveying a first clock signal from the memory controller to the memory;
receiving information indicative of a duty cycle of the first clock signal, wherein the duty cycle of the first clock signal is determined in the memory;
causing adjustment of the duty cycle of the first clock signal if the duty cycle is not within a specified range; and
if the duty cycle is not within the specified range, repeating said conveying, receiving information and adjusting until the duty cycle of the first clock signal is within the specified range;
performing, using the calibration control circuit, a second calibration, wherein performing the second calibration includes the memory conveying a second clock signal to the memory controller, the second clock signal being based on the first clock signal;
adjusting the duty cycle of the first clock signal based on the second calibration;
determining, during performance of the first and second calibrations and using an eye calculation circuit implemented in the calibration control circuit, a range of delay values, as applied to the second clock signal, at which data can be correctly read from memory;
adjusting a delay value applied to the second clock signal based on determining the range of delay values; and
performing additional adjustments of the duty cycle of the first clock signal based on determining and adjusting the delay values.

2. The method as recited in claim 1, wherein the first clock signal is a write data strobe used to synchronize writes performed to the memory.

3. The method as recited in claim 1, wherein the second clock signal is a read data strobe used to synchronize reads of data from the memory.

4. The method as recited in claim 1, further comprising a duty cycle monitor circuit determining the duty cycle of the first clock signal and providing an indication of the duty cycle of the first clock signal to the memory controller.

5. The method as recited in claim 1, further comprising an adjuster circuit in the memory performing adjustment of the duty cycle.

6. The method as recited in claim 1, wherein performing the second calibration includes performing a plurality of reads of data conveyed from the memory to the memory controller.

7. The method as recited in claim 1, further comprising clock generation circuitry in the memory receiving the first clock signal and generating the second clock signal based on the first clock signal.

8. The method as recited in claim 1, further comprising a delay circuit implemented in the memory controller varying a delay applied to the second clock signal, as received from the memory, during performing of the second calibration.

9. An apparatus comprising:
a memory;
a memory controller coupled to the memory, wherein the memory controller includes a calibration control circuit configured to:
  cause a first calibration to be performed, wherein performing the first calibration includes the memory controller causing transmissions of a first clock signal to the memory until an indication is received from the memory that a duty cycle of the first clock signal is within a specified range;
  cause a second calibration to be performed, the second calibration including the memory conveying a second clock signal to the memory controller;
  cause an adjustment of the duty cycle of the first clock signal based on the second calibration;
  determine, during performance of the first and second calibration and using an eye calculation circuit, a range of delay values, as applied to the second clock signal, at which data can be correctly read from memory;
  adjust a delay value applied to the second clock signal based on determining the range of delay values; and
  perform additional adjustments of the duty cycle of the first clock signal based on determining and adjusting the delay values.

10. The apparatus as recited in claim 9, wherein the memory includes a duty cycle monitor circuit configured to determine the duty cycle of the first clock signal and further configured to generate the indication when the duty cycle is within the specified range.

11. The apparatus as recited in claim 9, wherein the memory includes an adjuster circuit configured to cause adjustments to the duty cycle of the first clock signal based on a code received from the calibration control circuit.

12. The apparatus as recited in claim 9, wherein the memory includes clock generation circuitry configured to receive the first clock signal and generate the second clock signal based on the first clock signal.

13. The apparatus as recited in claim 9, wherein the first clock signal is a write data strobe signal.

14. The apparatus as recited in claim 9, wherein the second clock signal is a read data strobe signal.

15. The apparatus as recited in claim 9, wherein the calibration control circuit is configured to cause the memory controller to perform a plurality of reads of data from the memory during performance of the second calibration.

16. The apparatus as recited in claim 9, wherein the eye calculation circuit is further configured to determine a range of voltage values at which data can be correctly read from the memory.

17. A system comprising:
a memory subsystem including a memory and a memory controller coupled to the memory, wherein the memory controller is configured to convey a first clock signal to the memory during writes of data thereto, and further coupled to receive a second clock signal from the memory during reads of data therefrom;
wherein the memory includes a duty cycle monitor circuit configured to determine a duty cycle of the first clock signal and further configured to provide an indication of the duty cycle of the first clock signal; and
wherein the memory controller includes a calibration control circuit configured to:
  cause a first calibration to be performed, wherein performing the first calibration includes the memory controller conveying the first clock signal to the memory until the indication is received from the duty cycle monitor circuit that the duty cycle of the first clock signal is within a specified range;
  cause a second calibration to be performed, the second calibration including the memory conveying the second clock signal to the memory controller; and
  cause an adjustment of the duty cycle of the first clock signal based on the second calibration;
  determine, during performance of the first and second calibration and using an eye calculation circuit, a range of delay values, as applied to the second clock signal, at which data can be correctly read from memory;
  adjust a delay value applied to the second clock signal based on determining the range of delay values; and
  perform additional adjustments of the duty cycle of the first clock signal based on determining and adjusting the delay values.

18. The system as recited in claim 17, wherein the memory further includes an adjustment circuit configured to change the duty cycle of the first clock signal responsive to a code provided from the calibration control circuit.

19. The system as recited in claim 17, wherein the memory further includes clock generation circuitry configured to generate the second clock signal based on the first clock signal.

20. The system as recited in claim 17, wherein the calibration control circuit is configured to cause a plurality of reads of data from the memory during performance of the second calibration.

* * * * *